(12) United States Patent
Guzman et al.

(10) Patent No.: US 11,800,670 B2
(45) Date of Patent: Oct. 24, 2023

(54) INFORMATION HANDLING SYSTEM WITH INTEGRATED LATCHES FOR STACKING ELECTRICAL ENCLOSURES

(71) Applicant: DELL PRODUCTS, LP, Round Rock, TX (US)

(72) Inventors: Richard Guzman, Austin, TX (US); Peter Clark, Zhongzheng District (TW); Sean O'Donnell, Brookline, MA (US); Kevin Keller, Austin, TX (US)

(73) Assignee: Dell Products L.P., Round Rock, TX (US)

(*) Notice: Subject to any disclaimer, the term of this patent is extended or adjusted under 35 U.S.C. 154(b) by 99 days.

(21) Appl. No.: 17/154,800

(22) Filed: Jan. 21, 2021

(65) Prior Publication Data

US 2022/0232719 A1    Jul. 21, 2022

(51) Int. Cl.
*H05K 5/02* (2006.01)
*H05K 5/03* (2006.01)
*H05K 7/14* (2006.01)

(52) U.S. Cl.
CPC ............. *H05K 5/03* (2013.01); *H05K 5/0221* (2013.01); *H05K 7/14* (2013.01)

(58) Field of Classification Search
CPC .......... H05K 5/03; H05K 5/0221; H05K 7/14; H05K 7/1485; H05K 5/0021
See application file for complete search history.

(56) References Cited

U.S. PATENT DOCUMENTS

| | | | | |
|---|---|---|---|---|
| 6,567,275 | B1* | 5/2003 | Hou ...................... | H05K 5/0021 361/740 |
| 7,545,650 | B2* | 6/2009 | Sanchez .................. | H05K 7/16 361/801 |
| 8,416,562 | B2* | 4/2013 | Ding ....................... | G06F 1/187 248/27.3 |
| 11,304,322 | B2* | 4/2022 | Lu ........................... | G06F 1/181 |
| 2010/0294905 | A1* | 11/2010 | Peng ....................... | G06F 1/187 248/222.12 |
| 2013/0279121 | A1* | 10/2013 | Lin ......................... | H05K 7/005 361/679.01 |
| 2016/0044819 | A1 | 2/2016 | Bailey et al. | |
| 2017/0071071 | A1 | 3/2017 | Tseng et al. | |
| 2017/0227997 | A1* | 8/2017 | Godfrey ................. | G06F 1/182 |
| 2020/0196466 | A1* | 6/2020 | Fischl .................... | H05K 5/0021 |
| 2021/0251098 | A1* | 8/2021 | Gao ....................... | G11B 33/128 |
| 2021/0274667 | A1* | 9/2021 | Lin ...................... | H05K 7/1411 |

* cited by examiner

*Primary Examiner* — Sagar Shrestha
(74) *Attorney, Agent, or Firm* — Larson Newman, LLP

(57) ABSTRACT

An information handling system includes a compute device, a side cover, and a bezel. The side cover is placed in physical communication with the compute device. The side cover includes a mounting latch that rotates between an open position and a closed position. When in the closed position, the mounting latch securely mounts the compute device on a component. When bezel is placed in physical communication with the side cover, the bezel locks the mounting latch in the closed position.

16 Claims, 9 Drawing Sheets

INFORMATION HANDLING SYSTEM WITH INTEGRATED LATCHES FOR STACKING ELECTRICAL ENCLOSURES

FIELD OF THE DISCLOSURE

The present disclosure generally relates to information handling systems, and more particularly relates to integrated latches for stacking electrical enclosures.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a compute device, a side cover, and a bezel. The side cover may be placed in physical communication with the compute device. The side cover includes a mounting latch that may rotate between an open position and a closed position. When in the closed position, the mounting latch securely may mount the compute device on a component. When bezel is placed in physical communication with the side cover, the bezel may lock the mounting latch in the closed position.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
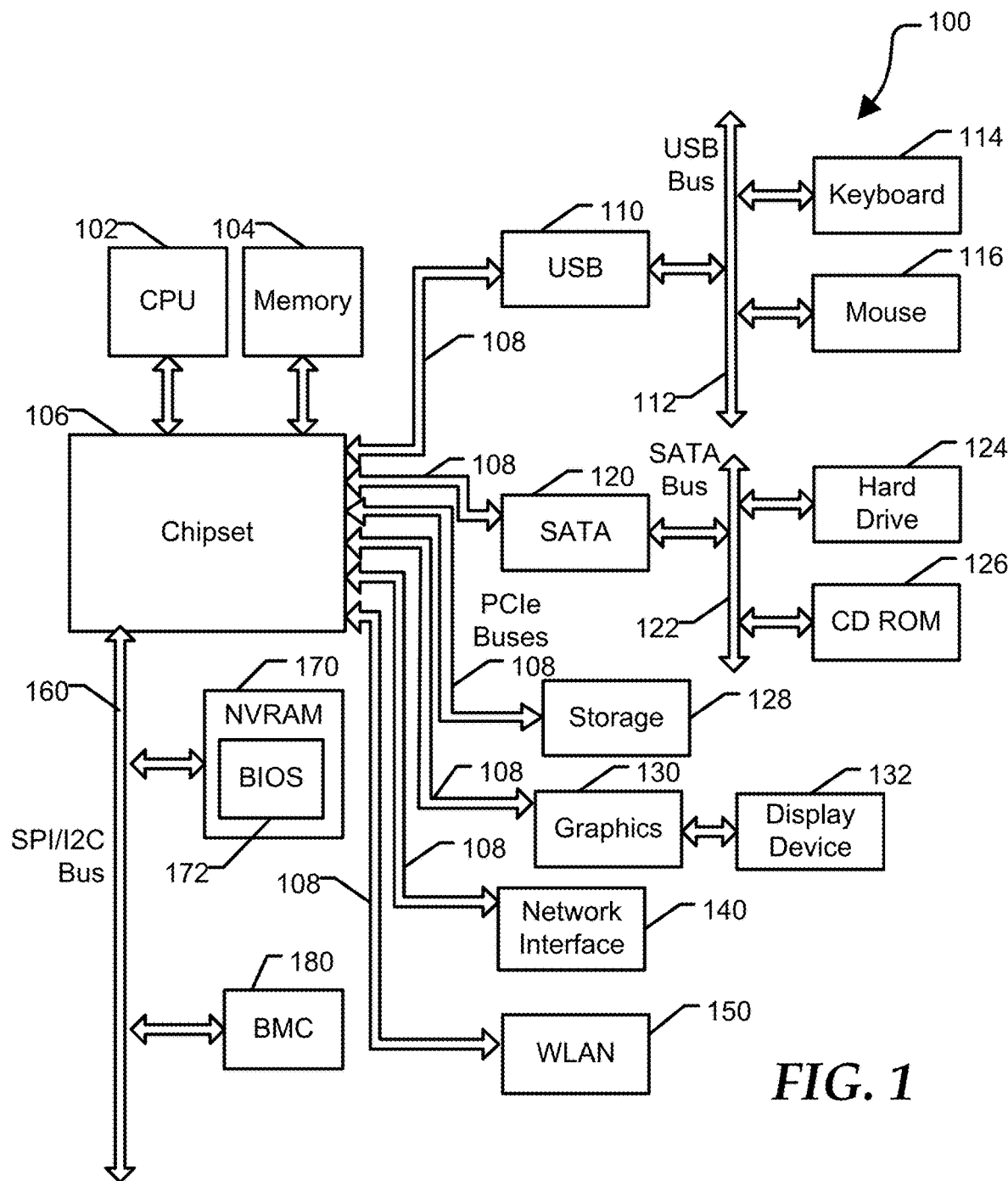
FIG. 1 is a block diagram of a general information handling system according to an at least one embodiment of the present disclosure.

FIG. 1 illustrates a general information handling system 100. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various other I/O devices, such as a keyboard, a mouse, and a video display. The information handling system may also include one or more busses operable to transmit communications between the various hardware components.

Information handling system 100 includes a processor 102, a memory 104, a chipset 106, one or more PCIe buses 108, a universal serial bus (USB) controller 110, a USB bus 112, a keyboard device controller 114, a mouse device controller 116, a configuration a SATA bus controller 120, a SATA bus 122, a hard drive device controller 124, a compact disk read only memory (CD ROM) device controller 126, a storage 128, a graphics device controller 130, a network interface controller (NIC) 140, a wireless local area network (WLAN) or wireless wide area network (WWAN) controller 150, a serial peripheral interface (SPI) bus 160, a NVRAM 170 for storing BIOS 172, and a baseboard management controller (BMC) 180. In an example, chipset 106 may be directly connected to an individual end point via a PCIe root port within the chipset and a point-to-point topology as shown in FIG. 1. BMC 180 can be referred to as a service processor or embedded controller (EC). Capabilities and functions provided by BMC 180 can vary considerably based on the type of information handling system. For example, the term baseboard management system is often used to describe an embedded processor included at a server, while an embedded controller is more likely to be found in a consumer-level device. As disclosed herein, BMC 180 represents a processing device different from CPU 102, which provides various management functions for information handling system 100. For example, an embedded controller may be responsible for power management, cooling management, and the like. An embedded controller included at a data storage system can be referred to as a storage enclosure processor.

System 100 can include additional processors that are configured to provide localized or specific control functions, such as a battery management controller. Bus 160 can include one or more busses, including a SPI bus, an I2C bus, a system management bus (SMBUS), a power management bus (PMBUS), and the like. BMC 180 can be configured to provide out-of-band access to devices at information handling system 100. As used herein, out-of-band access herein refers to operations performed prior to execution of BIOS 172 by processor 102 to initialize operation of system 100.

BIOS 172 can be referred to as a firmware image, and the term BIOS is herein used interchangeably with the term firmware image, or simply firmware. BIOS 172 includes instructions executable by CPU 102 to initialize and test the hardware components of system 100, and to load a boot loader or an operating system (OS) from a mass storage device. BIOS 172 additionally provides an abstraction layer for the hardware, such as a consistent way for application programs and operating systems to interact with the keyboard, display, and other input/output devices. When power is first applied to information handling system 100, the system begins a sequence of initialization procedures. During the initialization sequence, also referred to as a boot sequence, components of system 100 are configured and enabled for operation, and device drivers can be installed. Device drivers provide an interface through which other components of the system 100 can communicate with a corresponding device.

Information handling system 100 can include additional components and additional busses, not shown for clarity. For example, system 100 can include multiple processor cores, audio devices, and the like. While a particular arrangement of bus technologies and interconnections is illustrated for the purpose of example, one of skill will appreciate that the techniques disclosed herein are applicable to other system architectures. System 100 can include multiple CPUs and redundant bus controllers. One or more components can be integrated together. For example, portions of chipset 106 can be integrated within CPU 102. Additional components of information handling system 100 can include one or more storage devices that can store machine-executable code, one or more communications ports for communicating with external devices, and various input and output (I/O) devices, such as a keyboard, a mouse, and a video display. An example of information handling system 100 includes a multi-tenant chassis system where groups of tenants (users) share a common chassis, and each of the tenants has a unique set of resources assigned to them. The resources can include blade servers of the chassis, input/output (I/O) modules, Peripheral Component Interconnect-Express (PCIe) cards, storage controllers, and the like.

Figure 2:
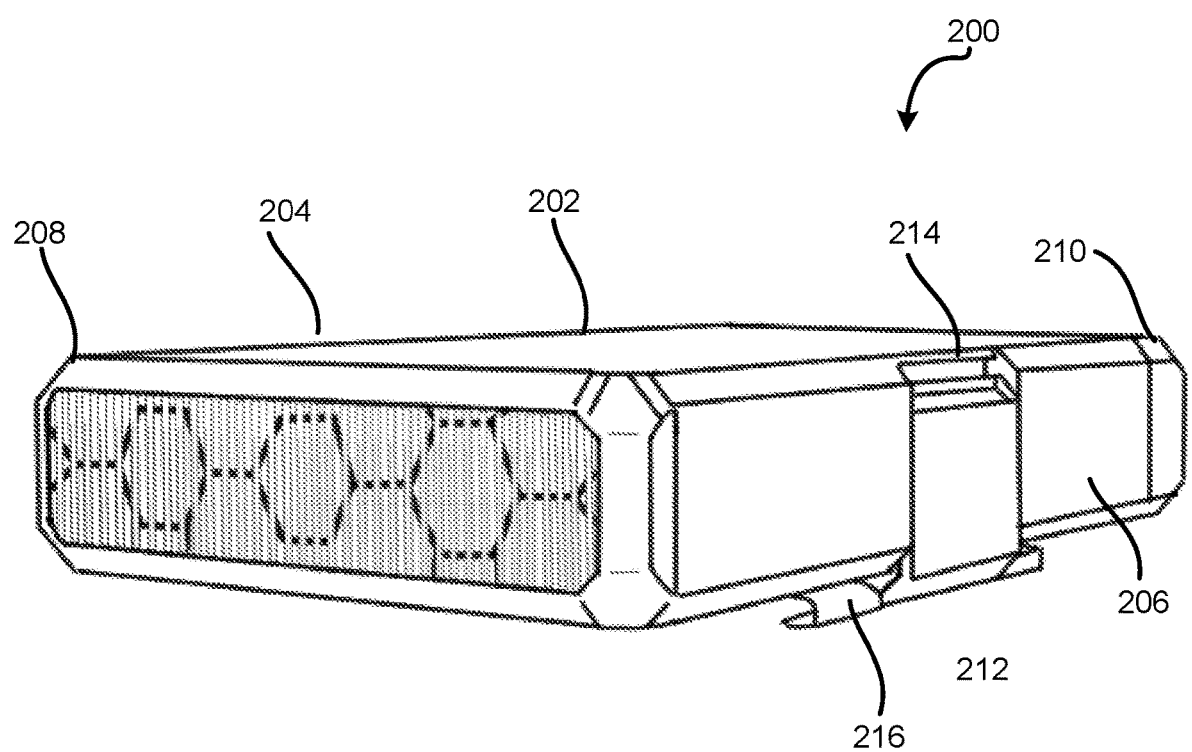
FIG. 2 is a diagram of an information handling system for mounting outside a traditional data center according to at least one embodiment of the disclosure.

In an example, information handling system 100 may be any suitable device including, but not limited to, compute device 202 of FIG. 2. Information handling system 100 can include a set of instructions that can be executed to cause the information handling system to perform any one or more of the methods or computer based functions disclosed herein. The information handling system 100 may operate as a standalone device or may be connected to other computer systems or peripheral devices, such as by a network.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

FIG. 2 illustrates an information handling system 200 including a compute device 202, side covers 204 and 206, bezels 208 and 210, mounting latch 212, and mounting lip 214 according to at least one embodiment of the disclosure. In an example, side covers 204 and 206 may be placed in physical communication with and attached to compute device 202 in any suitable manner. For example, side covers 204 and 206 may snap fit onto compute device 202, may slide onto the compute device, or the like. After side covers 204 and 206 are attached to compute device 202, bezels 208 and 210 may be placed in physical communication with the compute device and with the side covers. In an example, bezels 208 and 210 may be secured to compute device 202 and side covers 204 and 206 in any suitable manner including, but not limited to, snap fitting onto the side covers.

In an example, compute device 202 may be utilized in any suitable location including, but not limited to, an edge environment located outside a traditional data center. In this example, the edge environment may not be as secure for compute device 202 and may not be equipped with traditional data center mounting components. In certain examples, compute device 202 may be mounted to any suitable component. For example, compute device 202 may be connected or mounted on another compute device, a mounting bracket 216, or the like. Mounting latch 212 may be utilized to securely attach compute device 202 to mounting bracket 216 as shown in FIG. 2. In certain examples, mounting bracket 216 may be any suitable standard or proprietary bracket including, but not limited to, a VESA bracket, a DIN bracket, and a custom wall mounted bracket. In an example, another compute device may be mounted on compute device 202 by the mounting latch of the other compute device snap fitting over mounting lip 214.

Figure 3:
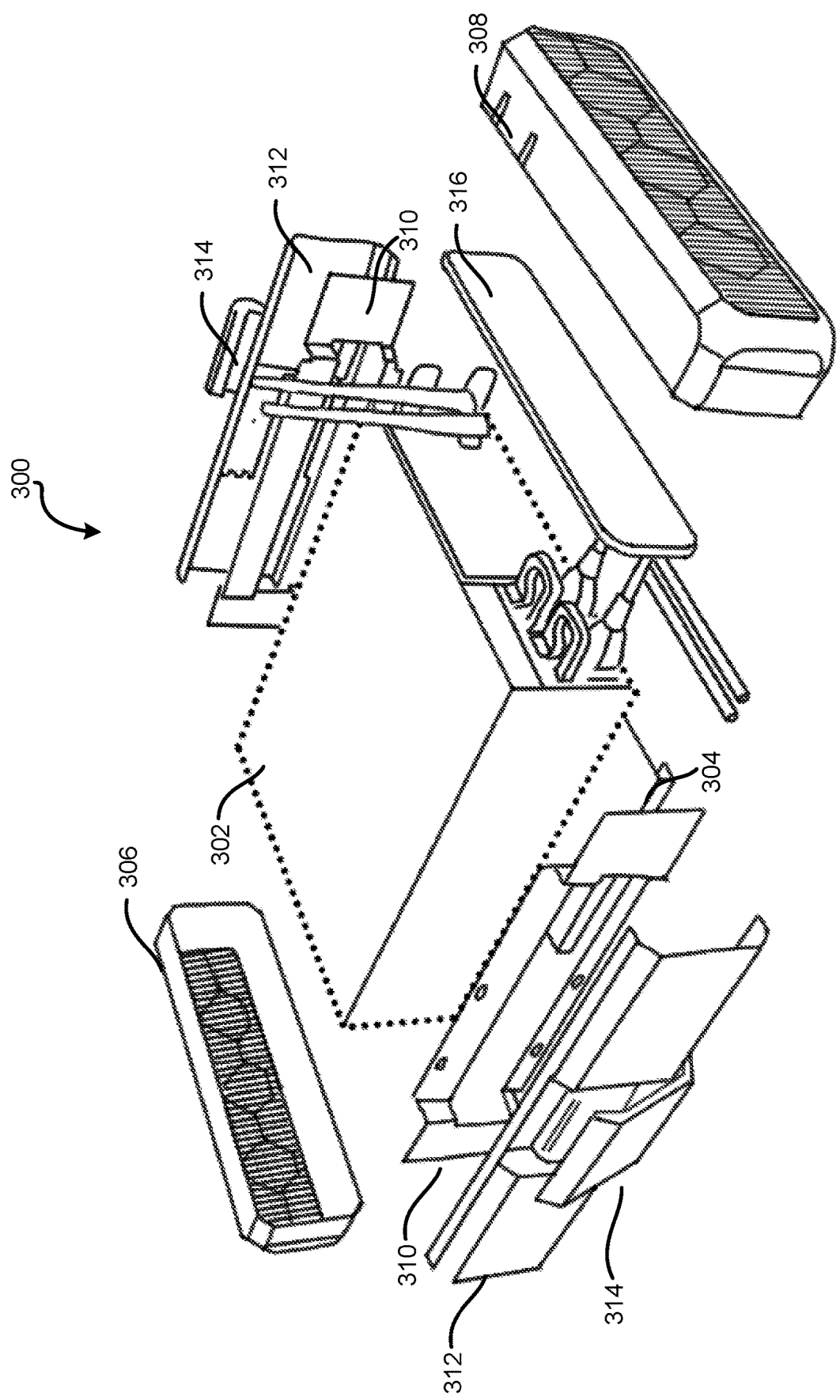
FIG. 3 is an exploded view of an information handling system for mounting outside a traditional data center according to at least one embodiment of the disclosure.

FIG. 3 illustrates an information handling system 300 according to at least one embodiment of the disclosure.

Information handling system 300 includes a compute device 302 a mounting bracket 304, bezels 306 and 308, side plates 310, side bezels 312, and mounting latches 314. In an example, a side cover, such as side cover 204 or 206 of FIG. 2, may include a side plate 310, a side bezel 312, and a mounting latch 314. In certain examples, information handling system 300 and compute device 302 may be substantially similar to respective information handling system 200 and compute device 202 of FIG. 2. Compute device 302 may be any suitable device including, but not limited to, a storage device, a server, and a router.

In an example, side plate 310 may be connected to side bezel 312 in any suitable manner. For example, side bezel 312 may include one or more posts to interface with openings within side plate 310, and the side bezel and side plate may snap fit together based on the posts being inserted with the openings. Side plates 310 may be connected to compute device 302 in any suitable manner including, but not limited to, snap fitting on side surfaces of the compute device, and being attached by screws or other mounting components. When a side cover, including side plate 310, side bezel 312, and mounting latch 314, is placed in physical communication with and secured to compute device 302, mounting latches 314 may be utilized to attach the compute device to mounting bracket 304. In an example, mounting latches 314 may interface with and lock onto mounting bracket 304 to securely hold compute device 302 in physical communication with the mounting bracket.

Prior to bezel 308 being attached to compute device 302, filter 316 may be inserted within bezel 308 to provide air filtration to airflow before the airflow enters the compute device. While filter 316 is illustrated in FIG. 3 as being incorporated within bezel 308, one of ordinary skill in the art would recognize that a filter may be utilized within bezel 306 without varying from the scope of this disclosure. When compute device 302 is securely connected to mounting bracket 304 or another compute device, bezels 306 and 308 may be attached to the compute device. In an example, one of bezels 306 and 308 may be utilized to lock mounting latches 314 in a closed position to securely connect compute device 302 to mounting bracket 304.

Figure 4:
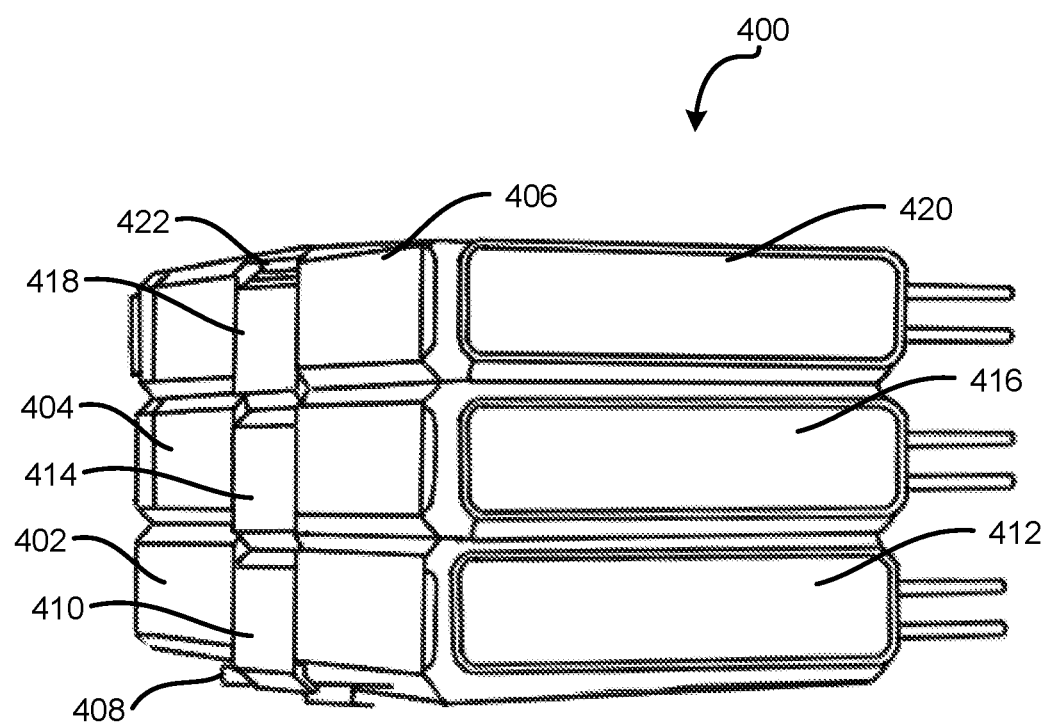
FIG. 4 is a diagram of multiple information handling systems integrated via latches according to at least one embodiment of the present disclosure.

FIG. 4 illustrates a system 400 including information handling systems 402, 404, and 406 according to at least one embodiment of the present disclosure. Information handling system 402 includes a mounting latch 410 and a bezel 412, information handling system 404 includes a mounting latch 414 and a bezel 416, and information handling system 406 includes a mounting latch 418 and a bezel 420. While only a single mounting latch is shown for each of information handling systems 402, 404, and 406, each of the information handling systems may include two mounting latches with a mounting latch on each side cover of the information handling system. Each of information handling systems 402, 404, and 406 includes a mounting lip on each side cover of the information handling system. For example, information handling system 406 includes mounting lip 422.

In an example, information handling systems 402, 404, and 406 may be connected in any suitable configuration, such as a stackable design as shown in FIG. 4. In the stackable design of FIG. 4, mounting latch 410 may transition from an opened position to a closed position to connect information handling system 402 to mounting bracket 408. Bezel 412 may be attached to information handling system 402 to lock mounting latch 410 in a closed position to securely connect the information handling system to mounting bracket 408. Information handling system 404 may be connected to information handling system 402 in any suitable manner. For example, mounting latch 414 may transition from an opened position to a closed position to snap fit around mounting lip of information handling system 402 and to connect information handling system 404 to information handling system 402. Bezel 416 may be attached to information handling system 404 to lock mounting latch 414 in the closed position and to securely connect information handling system 404 to information handling system 402.

Information handling system 406 may be connected to information handling system 404 in any suitable manner. For example, mounting latch 418 may transition from an opened position to a closed position to snap fit around mounting lip of information handling system 404 and to connect information handling system 406 to information handling system 404. Bezel 420 may be attached to information handling system 406 to lock mounting latch 418 in the closed position and to securely connect information handling system 406 to information handling system 404. While only a single stackable design for interfacing information handling systems 402, 404, and 406 is shown in FIG. 4, the information handling systems may be connected together in any suitable configuration and orientation via the mounting latches and mounting lips without varying from the scope of this disclosure.

Figure 5:
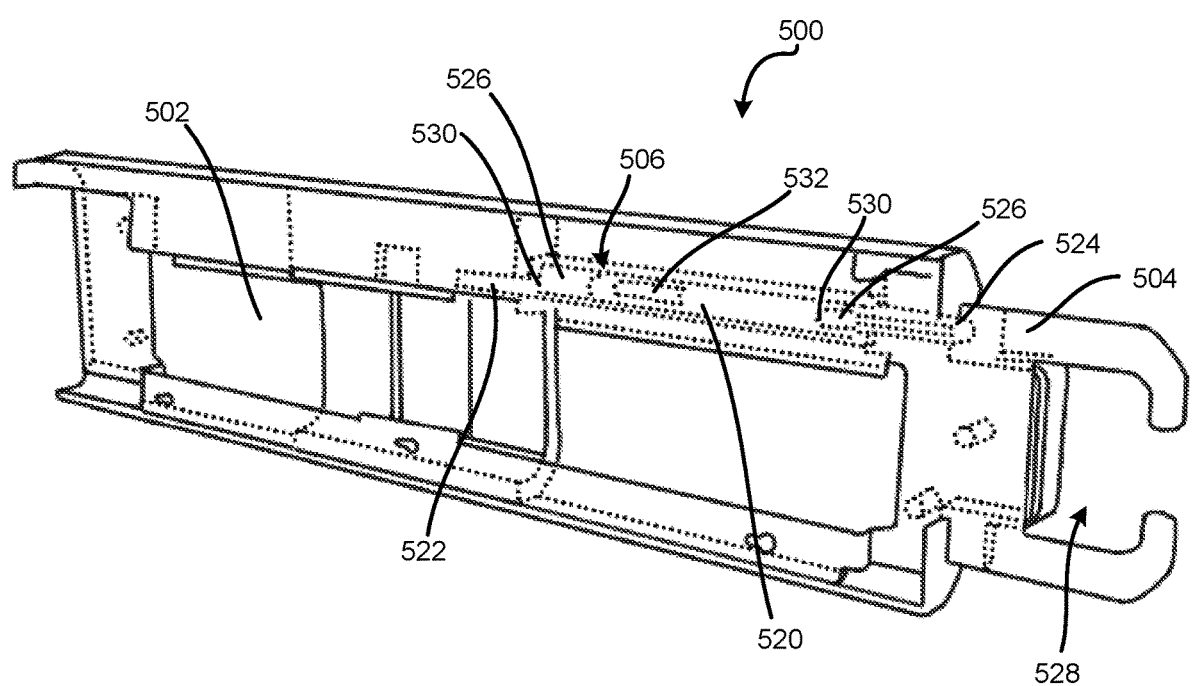
FIGS. 5 and 6 are diagrams of a side plate and a plunger assembly for an information handling system according to at least one embodiment of the present disclosure.
Figure 6:
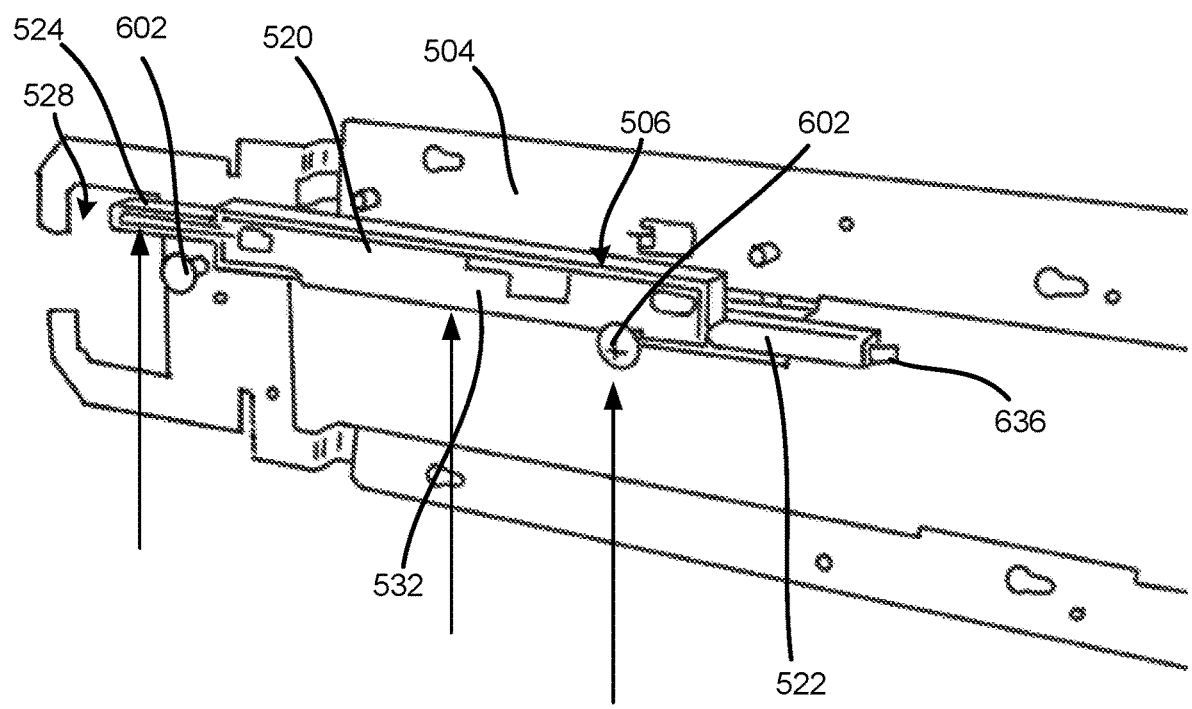

FIGS. 5 and 6 illustrate portions of a side cover 500 including a side bezel 502, a side plate 504, and a plunger assembly 506 according to at least one embodiment of the present disclosure. Plunger assembly 506 includes a main portion 520, a rod portion 522, a lock arm 524, and slots 526. Side plate 504 and plunger assembly 506 may be connected to side bezel 502 in any suitable manner. For example, side plate 504 and plunger assembly 506 may be inserted within side bezel 502 and then secured by attachment components. In an example, the attachment components may include screws and heat stake posts. Side plate 504 may be any suitable rigid material including sheet metal and plastic. In an example, side plate 504 may extend past side bezel 502 to provide an opening 528 and support from cable routing from a compute node.

Referring now to FIG. 6, plunger assembly 506 may held in physical communication with side plate 504 via retaining screws 602. In an example, retaining screws 602 may provide an alignment for plunger assembly 506, such that the plunger assembly may remain in physical communication with side plate 504. As shown in FIG. 6, plunger assembly 506 includes a locking pin 604 extended from an end of rod portion 522.

Referring back to FIG. 5, posts 530 may be inserted through slots 526 to guide plunger assembly between first and second positions. In an example, a single post 530 may interface with a single slot 526. For example, post 530 may be in physical communication with one end of slot 526 when plunger assembly 506 is in a first position, and the post may be in physical communication with an opposite end of the slot when the plunger assembly is in a second position. A spring 532 may be in physical communication with both side plate 504 and main portion 520 of plunger assembly 506. In certain examples, spring 532 may bias plunger assembly 506 toward either the first or second position. For example, spring 532 may be positioned to bias plunger assembly 506 toward the first position.

In an example, lock arm 524 of plunger assembly 506 may extend beyond an outer surface of side bezel 502 when the plunger assembly is in the first position. In response to a force being exerted on lock arm 524, plunger assembly 506 may transition from the first position to the second position. In an example, the force exerted on lock arm 524 should be greater than the force exerted on plunger assembly 506 by spring 532 so that the plunger assembly may transition from the first position to the second position. When plunger assembly 506 is in the second position rod portion 522 may slide toward and locking pin 604 of FIG. 6 may interface with a mounting latch to lock the mounting latch in a closed position.

Figure 7:
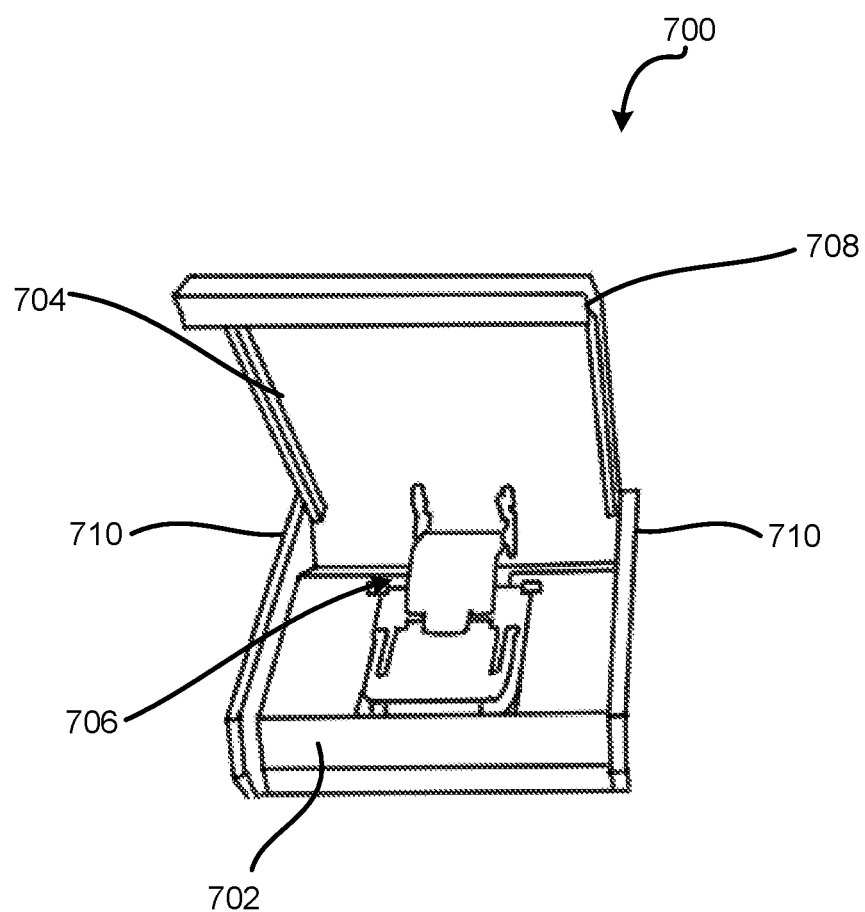
FIG. 7 is a diagram of a mounting latch for an information handling system according to at least one embodiment of the present disclosure.

FIG. 7 a mounting latch 700 according to at least one embodiment of the present disclosure. Mounting latch 700 includes a base 702, a top 704, and a hinge 706. In an example, hinge 706 may enable top 704 to rotate between an opened position and a closed position with respect to base 702. Top 704 includes a hook portion 708 at a distal end of the top with respect to an end of the top in physical communication with base 702. In an example, mounting latch 700 may secure an information handling system associated with the mounting latch to another component by hook portion 708 snap fitting over the other component, such as a mounting bracket or another information handling system. For example, hook portion 708 may snap fit over mounting lip 422 of FIG. 4 to secure two information handling systems together.

In certain examples, mounting latch 700 includes one or more holes 710 to interface with a plunger assembly, such as plunger assembly 506 of FIGS. 5 and 6. In an example, holes 710 may extend through both bottom 702 and top 704 of mounting latch 700, and a locking pin, such as locking pin 604 of FIG. 6, may be inserted through the hole. In response to locking pin 604 being inserted within hole 710, mounting latch 700 may locked in the closed position and securely hold information handling systems in physical communication.

Figure 8:
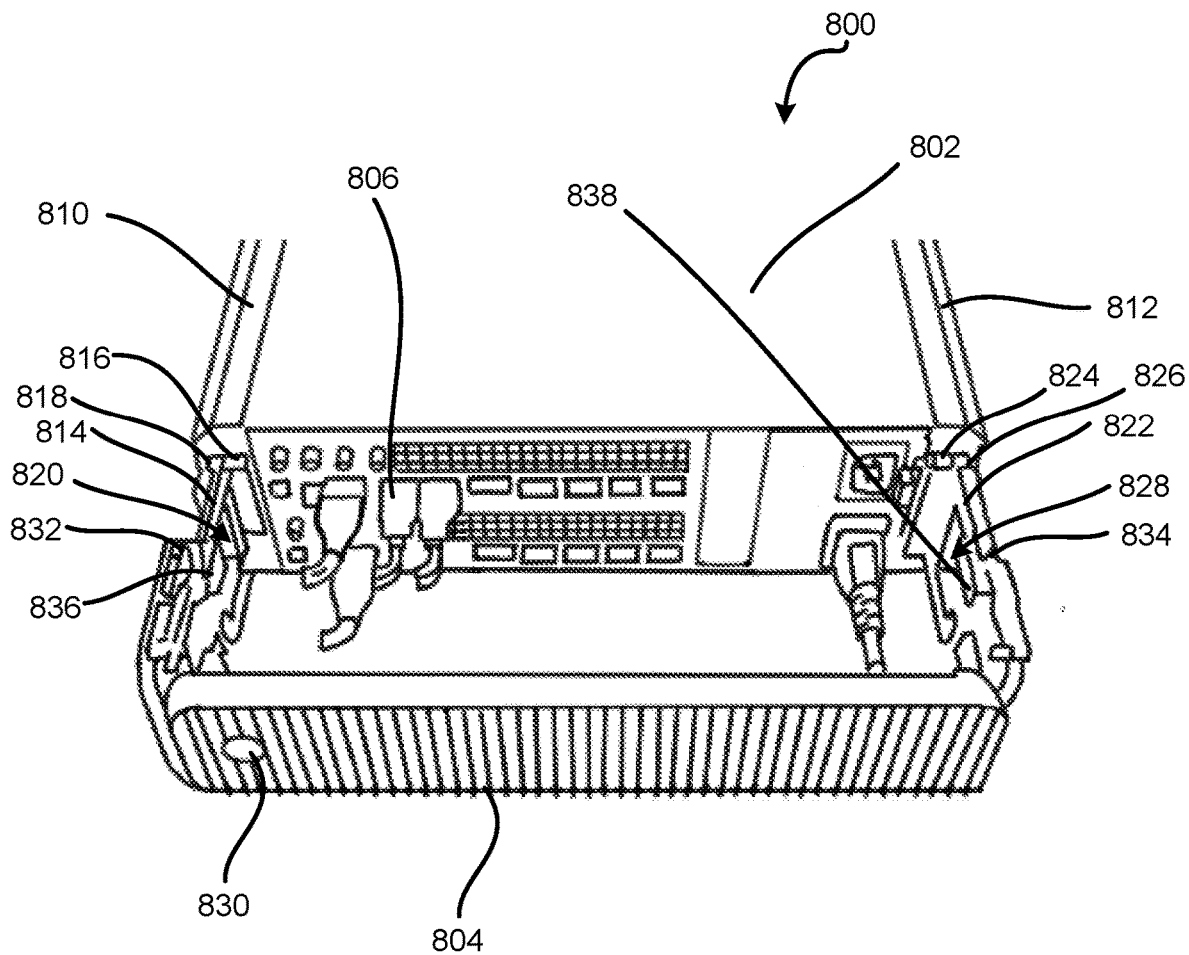
FIG. 8 is a diagram of rear panel of an information handling system and a bezel according to at least one embodiment of the disclosure.

FIG. 8 illustrates a portion of an information handling system 800 including a compute device 802, a bezel 804, and one or more cables 806 according to at least one embodiment of the disclosure. Cable 806 may be routed from a rear surface of compute device 802. Side covers 810 and 812 may be placed in physical communication with compute device 802. Side cover 810 includes a side plate 814, a plunger assembly 816, and a hook 818. In an example, side plate 814 includes a cable router 820 to enable cables 806 to extend beyond the side plate and bezel 804. Side cover 812 includes a side plate 822, a plunger assembly 824, and a hook 826. In an example, side plate 822 includes a cable router 828 to enable cables 806 to extend beyond the side plate and bezel 804. Bezel 804 includes a lock 830, hooks 832 and 834, and stops 836 and 838.

Side covers 810 and 812 may be connected to compute device 802 in any suitable manner including, but not limited to, snap fitting on side surfaces of the compute device, and being attached by screws or other mounting components. When side cover 812 and 814 are placed in physical communication with and secured to compute device 802, mounting latches of the side covers may be utilized to attach the compute device to another component, such as a mounting bracket or another information handling system. In an example, mounting latches of side covers 810 and 812 may interface with and lock onto another component to securely hold compute device 802 in physical communication with the other component in any suitable manner including, but not limited to, the manner described above with respect to FIGS. 3 and 4.

When compute device 802 is securely connected to a mounting bracket or another compute device, bezel 804 may be attached to the compute device. In an example, as bezel 804 is placed in physical communication with side cover 810, stop 836 may exert a force on plunger assembly 816. The force exerted on plunger assembly 816 may cause the plunger assembly to transition from a first position to a second position and to lock a mounting latch of side cover 810 as described above. Similarly, as bezel 804 is placed in physical communication with side cover 812, stop 838 may exert a force on plunger assembly 824. The force exerted on plunger assembly 824 may cause the plunger assembly to transition from a first position to a second position and to lock a mounting latch of side cover 812 as described above.

In an example, as bezel 804 is placed in physical communication with side covers 810 and 812, hook 832 may snap fit over hook 818 and hook 834 may snap fit over hook 826. In response to hook 832 snap fitting over hook 818 and hook 834 snap fitting over hook 826, bezel 804 may be attached to compute device 802 and side covers 810 and 812. In an example, bezel 804 may prevent access to cables 806, such that an individual may not be able to unplug a cable 806 from or plug a new cable into the rear surface of compute device 802. In this example, bezel 804 may provide a secure environment for cables 806.

Figure 9:
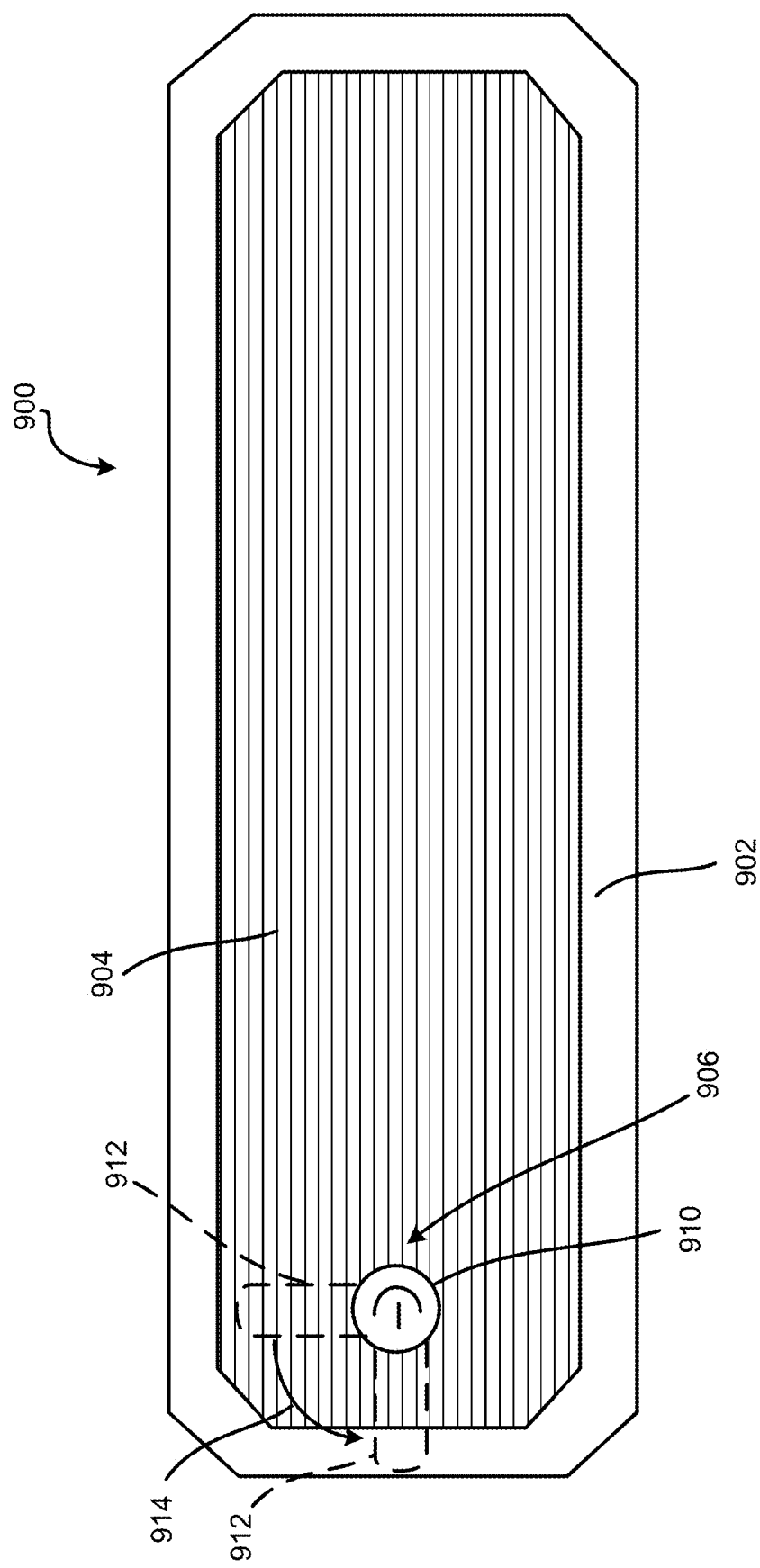
FIG. 9 is a block diagram of a bezel for an information handling system according to at least one embodiment of the present disclosure.

FIG. 9 illustrates a bezel 900 for an information handling system according to at least one embodiment of the present disclosure. Bezel 900 includes a main frame 902, an airflow portion 904, and a lock 906. Lock 906 includes a key portion 910 and a latch 912. Lock 906 may be any suitable type of lock including, but not limited to a barrel lock.

In an example, an individual may utilize a key to rotate lock 906 from an unlocked position to a locked position as indicated by arrow 914. When lock 906 is in the locked position, latch 912 may interface with a side cover of a compute device, such as side cover 810 of compute device 802 in FIG. 8. In response to lock 906 being in the locked position, bezel 900 may be securely mounted on the compute device. When bezel 900 is secured in physical communication with a compute device, the bezel may prevent a plunger assembly from transitioning from a second position to a first position, which in turn prevents a mounting latch from transitioning from a locked position as described above. Thus, while bezel 900 is locked onto a compute device, the compute device may not be removed from a mounting bracket or another compute device that the compute device is attached via the locked mounting latch. Therefore, a plunger assembly, such a plunger assembly 506 of FIG. 5, and bezel 900 may enable a compute device to be securely mounted in any environment even when the environment is outside a traditional data center.

Referring back to FIG. 1, the information handling system 100 can include a disk drive unit and may include a computer-readable medium, not shown in FIG. 1, in which one or more sets of instructions, such as software, can be embedded. Further, the instructions may embody one or more of the methods or logic as described herein. In a particular embodiment, the instructions may reside completely, or at least partially, within system memory 104 or another memory included at system 100, and/or within the processor 102 during execution by the information handling system 100. The system memory 104 and the processor 102 also may include computer-readable media.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a processor or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a compute device;
   a side cover to be placed in physical communication with the compute device, the side cover including:
   a mounting latch to rotate between an open position and a closed position, when in the closed position the mounting latch to securely mount the compute device on a component;
   a bezel that when in physical communication with the side cover locks the mounting latch in the closed position; and
   a plunger assembly to transition between first and second positions, when the plunger assembly is in the second position, the plunger assembly locks the mounting latch in the closed position, wherein the bezel pushes the plunger assembly to the second position when the bezel is in physical communication with the side cover.

2. The information handling system of claim 1, wherein the plunger assembly further includes: a spring to bias the plunger assembly towards the first position.

3. The information handling system of claim 1, wherein the side cover further includes:
   a mounting lip to receive a second mounting latch of a second information handling system, wherein the reception of the second mounting latch by the mounting lip secures the information handling system to the second information handling system.

4. The information handling system of claim 1, wherein the bezel further comprises:
   a lock to rotate between an unlock position and a locked position, the lock to securely mount the bezel to the side cover and to the compute device when in the lock is in the locked.

5. The information handling system of claim 4, wherein the mounting latch is continuously held in the closed position while the bezel is securely mounted to the side cover and to the compute device.

6. The information handling system of claim 1, wherein the component is another compute device.

7. The information handling system of claim 1, wherein the component is a wall mount bracket.

8. An information handling system comprising:
   a compute device;
   a side cover including:
   a mounting latch to rotate between an open position and a closed position, when in the closed position, the mounting latch to securely mount the compute device on a component;
   a plunger assembly including a pin, the plunger assembly to transition between first and second positions, wherein the pin of the plunger assembly is inserted into the mounting latch to lock the mounting latch in the closed position when the plunger assembly is in the second position; and
   a bezel in communication with the side cover, the bezel locking the mounting latch in the closed position, wherein the bezel pushes the plunger assembly to the second position when the bezel is in physical communication with the side cover.

9. The information handling system of claim 8, wherein the plunger assembly further includes:
   a spring to bias the plunger assembly towards the first position.

10. The information handling system of claim 8, wherein the bezel further comprises:
    a lock to rotate between an unlock position and a locked position, the lock to securely mount the bezel to the side cover and to the compute device when in the lock is in the locked.

11. The information handling system of claim 8, wherein the bezel further comprises: a mounting lip to receive a second mounting latch of a second information handling system, wherein the reception of the second mounting latch by the mounting lip secures the information handling system to the second information handling system.

12. The information handling system of claim 8, wherein the mounting latch is continuously held in the closed position while the bezel is securely mounted to the side cover and to the compute device.

13. The information handling system of claim 8, wherein the component is another compute device.

14. The information handling system of claim 8, wherein the component is a wall mount bracket.

15. An information handling system comprising: a compute device; a side cover including: a mounting latch rotatable between an open position and a closed position, wherein when in the closed position the mounting latch to securely mount the compute device on a component; a plunger assembly transitionable between first and second positions, when the plunger assembly, is in the second position, the plunger assembly locks the mounting latch in the closed position; and a mounting lip to receive a second mounting latch of a second information handling system, wherein the reception of the second mounting latch by the mounting lip secures the information handling system to the second information handling system; a bezel that when in communication with the side cover locks the mounting latch in the closed position; and wherein the bezel pushes the plunger assembly to the second position when the bezel is in physical communication with the side cover.

16. The information handling system of claim 15, wherein the mounting latch is continuously held in the closed position while the bezel is securely mounted to the side cover and to the compute device.

* * * * *